United States Patent
Hsu (12)

(10) Patent No.: US 6,339,340 B1
(45) Date of Patent: Jan. 15, 2002

(54) APPARATUS FOR DETECTING CAPACITY OF A STANDBY POWER AND METHOD THEREFOR

(75) Inventor: Hsien-Yueh Hsu, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 09/172,413

(22) Filed: Oct. 14, 1998

(30) Foreign Application Priority Data

Jun. 16, 1998 (TW) .......................................... 87109583

(51) Int. Cl.[7] ........................ G01R 31/40; G01N 27/416
(52) U.S. Cl. ............................ 324/771; 324/429; 429/92
(58) Field of Search ................................ 324/426, 427, 324/429, 771; 429/22, 23, 61, 90, 91, 92

(56) References Cited

U.S. PATENT DOCUMENTS 5,397,999 A * 3/1995 Kanamaru .................. 324/771
5,537,030 A * 7/1996 Snodgrass et al. ........ 324/158.1
5,905,439 A * 5/1999 McIntyre ................ 324/771 X

* cited by examiner

Primary Examiner—Glenn W. Brown
(74) Attorney, Agent, or Firm—Rabin & Berdo, P.C.

(57) ABSTRACT

An apparatus and a method of detecting the capacity of the standby power. First, the components that are supplied with working voltage from the standby power are switched to the main power by a switch circuit. Then a control unit activates a dummy-loading circuit, thereby a coupling a loading device to the standby power. A voltage monitoring circuit monitors variations of the standby power to judge the capacity of the standby power, by which the switch circuit decides whether the standby power is activated or not. When detecting the capacity of the standby power, a switch circuit is needed to prevent variations of the standby power from affecting the normal operation of the essential circuit, and the standby power is supplied as operating power.

11 Claims, 7 Drawing Sheets

APPARATUS FOR DETECTING CAPACITY OF A STANDBY POWER AND METHOD THEREFOR

CROSS-REFERENCE TO RELATED APPLICATION

This application claims the priority benefit of Taiwan application serial no. 87109583, filed Jun. 16, 1998, the full disclosure of which is incorporated herein by reference.

BACKGROUND OF THE INVENTION

1. Field of Invention

The present invention relates to an apparatus for detecting capacity of a standby power and a method therefor. More particularly, the present invention relates to an apparatus and a method, which can automatically detect capacity of a standby power of a power supply in a computer system and ensure normal operation of the computer system. By assistance of a program, the user can decide whether additional functions of the computer system are added or not.

2. Description of Related Art

In the earlier development of a personal computer, the power supply was controlled by hardware. As shown in FIG. 1, a power supply 110 provides operating power for the computer system 120. The power supply is coupled to an external power source 100 through a switch 115. When the computer system is ready to work, the switch 115 is then turned on, that is, the power supply 110 is coupled to the external power source 100. In the meantime, the power supply 110 begins to supply power for the computer system 120.

When the computer system 120 is ready to shut down or in a status of being turned off, the switch 115 is turned off, that is, the power supply 110 is separated from the external power source 100. The power supply 110 cannot provide any power for the computer system 120. In the above-mentioned way, it is impossible for the computer system 120 to be turned on automatically.

However, with tremendous development of technology, personal computers are considerably popularized and owned by general consumers, and not restricted in professional persons. Easily learned software and hardware are more and more important. For accommodating the trend, some new specifications have been developed in the personal computer field for providing some functions suitable for general users.

For providing good integration and performance of personal computers, an ATX specification for personal computer was developed. It is not the only way for computers to be turned on or turned off by the power supply in a conventional simple way. The status of being turned on or turned off for personal computers can be controlled by an internal circuit of the computer.

FIG. 2 shows a block diagram of a personal computer corresponding to the ATX specification. The power supply 210 provides operating power PWR for the computer system 220, and also provides standby power SBPW for a power control device 225. Whenever the power supply 210 is coupled to a external power source 200, the power supply 210 can simultaneously provide an operating power PWR to the computer system 220 and standby power SBPW to the power control device 225. When the computer system 220 is turned off, the power supply 210 stops to provide the PWR to the computer system 220. But, in the meantime, the power supply 210 still provides the standby power SBPW to the power control device 225.

The power control device 225 provides multiple ways to turn on the computer system 220, such as remote wakeup or keyboard wakeup. The standby power SBPW is not only supplied to the power control device 225, but also applied to execute a function of ceasing operation of the computer system 220 and suspending information to random access memories (RAMs) in some advanced computers. The function of ceasing, and suspending information to RAM, was developed along with multi-tasking and graphic user interface (GUI) of the operating system of the computer system 220. A resulting disadvantage of multi-tasking and GUI of an operating system is that it takes a comparatively long time to restart the operating system. The computer system 220 also cannot store the configuration while being turned off.

The function of ceasing operation, and suspending information to RAM, can store the configuration in the memory when the computer system is turned off. In the meantime, the standby power SBPW is applied to the memory, by which the information stored in the memory, will not be lost. When the computer system is turned on, the computer system can be restored rapidly to a primary status according to the information stored in the memory.

Because more and more functions are added in the computer system using additional standby power the users have greater convenience when operating a computer system. In the meantime, the demand for a higher capacity of the standby power is increased. But a conventional power supply having standby power corresponds to different specifications. For example, the standby power in the ATX specification of an earlier version is 10 mA, but the standby power in the ATX specification of a later version is 720 mA. The standby powers in different versions are quite different. The conventional computer systems cannot automatically detect the power supplies of different versions. The users have to distinguish the power supply by themselves, and a proper setting is completed according to their judgments. If the users cannot distinguish the power supply, and make some improper settings as a result, the additional functions of the computer system may work improperly. Furthermore, the whole computer system may work improperly, or even may not be able to be turned on. Thus, the greater convenience for the user cannot be achieved, but the additional functions can cause problems for the user.

Accordingly, the conventional computer system, which cannot detect capacity of the standby power, has some drawbacks. One of the drawbacks is that users have to judge the capacity of the standby power by themselves. If a label of the power supply is not clear or the user makes an incorrect judgment, the computer system may, as described above, work improperly, or even may not be able to be turned on.

In light of the foregoing, there is a need to provide a computer system that can automatically detect the capacity of the standby power, to ensure the normal operation of the computer system and bring users some additional convenient functions.

SUMMARY OF THE INVENTION

Accordingly, the present invention provide an apparatus for detecting capacity of a standby power of a power supply for a computer system and ensure normal operation of the computer system. By assistance of a program, the user can turn on or turn off an additional function of the computer system.

To achieve these and other advantages and in accordance with the purpose of the invention, as embodied and broadly described herein, the invention provides an apparatus for detecting capacity of a standby power of a power supply. The apparatus comprises a control unit, a dummy-loading circuit and a voltage monitoring circuit. The control unit is used for operating the apparatus. The dummy-loading circuit coupled to the standby power and the control unit is used for providing a load to the standby power under the control of the control unit. The voltage monitoring circuit coupled to the dummy-loading circuit and the control unit is used for monitoring the standby power through the dummy-loading circuit and for outputting a signal to the control unit. While the standby power is being detected, the control unit activates the dummy-loading circuit and receives information about variations of the standby power from the signal outputted from the voltage monitoring circuit. Thus, when the variation of the standby power exceed a prescribed voltage, the capacity of the standby power is not enough.

In the above-described apparatus, the dummy-loading circuit comprises a loading device and a switch. The loading device is coupled to the standby power through the switch. The switch is under control of the control unit. When the switch is turned on, the loading device is coupled to the standby power and is the load of the standby power. When the switch is turned off, the loading device is separated from the standby power and is not the load of the standby power.

A subsystem of the computer comprises a first subsystem and a second subsystem. The first subsystem is used for normal operation of the computer system, wherein operating power of the first subsystem is provided by the standby power. The second subsystem is used for additional functions of the computer system, wherein operating power of the second subsystem is provided by the standby power. The abnormal operating of the second subsystem do not affect the normal operation of the computer system.

The switch circuit comprises a first switch circuit. The operating power of the first subsystem is provided by the standby power through the first switch. When the capacity of the standby power is detected to be lower than the prescribed voltage, the operating power of the first subsystem is switched to the main power by the first switch circuit.

The switch circuit further comprises a second switch circuit. When the capacity of the standby power is detected to be not enough, the operating power of the second subsystem is switched to the main power. When the capacity of the standby power is detected to be enough, the operating power of the second subsystem is switched to the standby power by the second switch.

To achieve these and other advantages and in accordance with the purpose of the invention, as embodied and broadly described herein, the invention provides a method for detecting capacity of a standby power of a power supply, wherein the method comprises providing a loading device coupled to the standby power to be a load of the standby power; monitoring variations of the standby power, wherein when the standby power is lower than a prescribed voltage, the standby power is not enough.

The method further comprises providing either the main power or the standby power to a subsystem of a computer system by a switch circuit.

The method further comprises switching the partial operating power of the subsystem of the computer to the main power when the load is coupled to the standby power and the standby power is reduced.

The method further comprises switching the partial operating power of the subsystem of the computer to be the main power when the capacity of the standby power is detected to be not enough; and switching the partial operating power of the subsystem to the standby power when the capacity of the standby power is detected to be enough.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

As known in the art, a protection circuit is added to a power supply to prevent some damage from occurring in the power supply when the current of the power supply exceeds a predetermined current. While designing the power supply, certain factors are different depending on the type of the power supply. Therefore, the type of the protection circuit is also different. When the output current of the power supply is over a prescribed current and the protection circuit works therefor, the changes between the outputted voltage and the outputted current are different.

Figure 1:
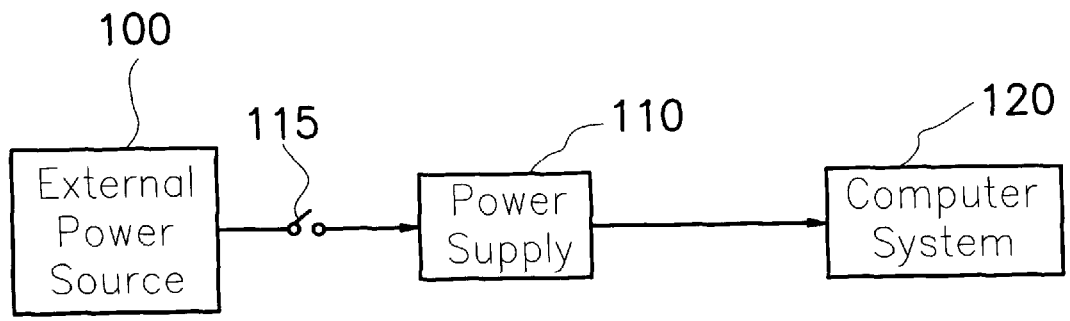
FIG. 1 shows block diagrams of a conventional computer system with a power supply.
Figure 2:
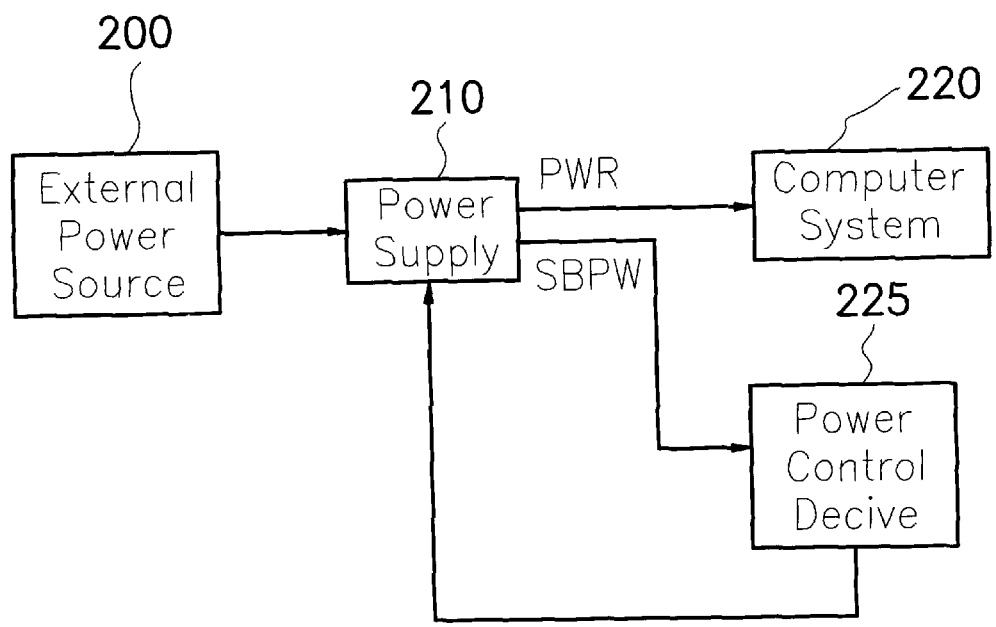
FIG. 2 shows block diagrams of a conventional computer system corresponding to the ATX specification.
Figure 3A:
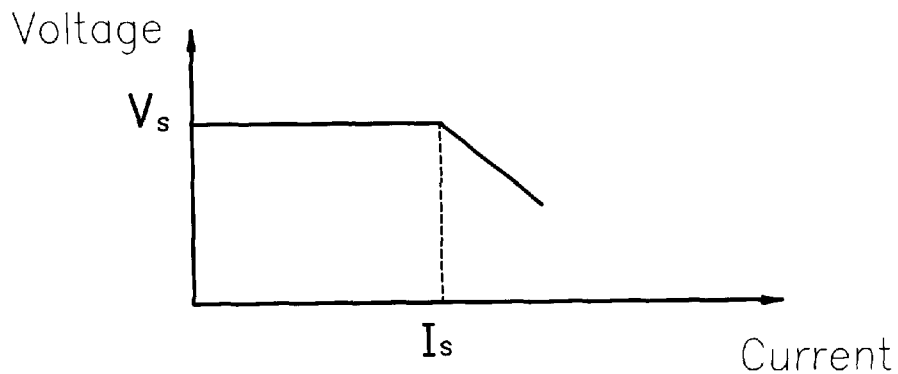
FIGS. 3A–3C show curves of variations of the current-voltage in three conventional protection circuits.
Figure 3B:
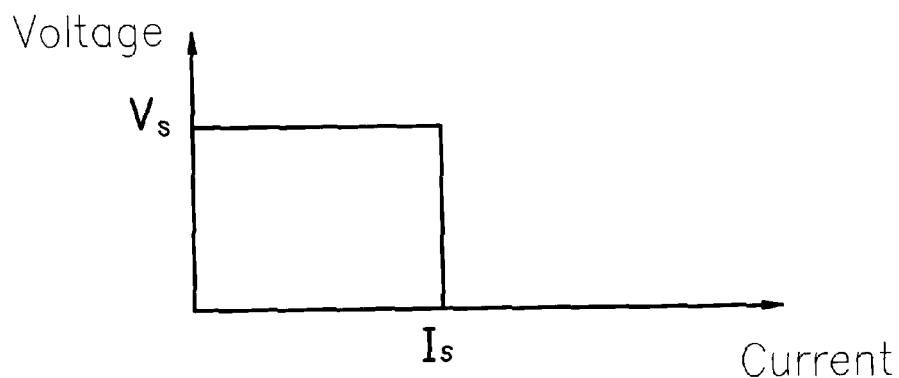
Figure 3C:
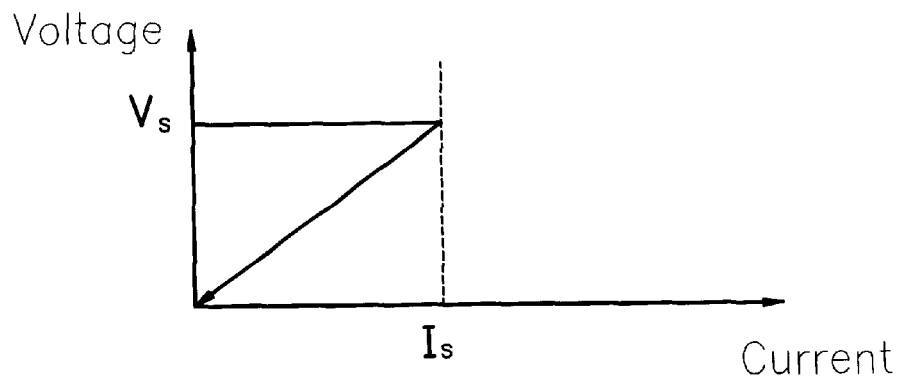

FIGS. 3A, 3B and 3C show curves of variations of the current-voltage in three ordinary protection circuits. As shown in FIG. 3A, the outputted voltage decreases slowly when the outputted current is over a predetermined current Is. As shown in FIG. 3B, the outputted voltage approaches zero when the outputted current is over a predetermined current Is. As shown in FIG. 3C, the outputted voltage and the outputted current simultaneously approache zero when the outputted current is over a predetermined current Is.

Although features of these three protection circuits are different, one similar feature is that the outputted voltage is lower than a normal outputted voltage when the outputted current is over some predetermined current. The invention makes use of this common feature to reach a goal of detecting the capacity of standby power.

Figure 4:
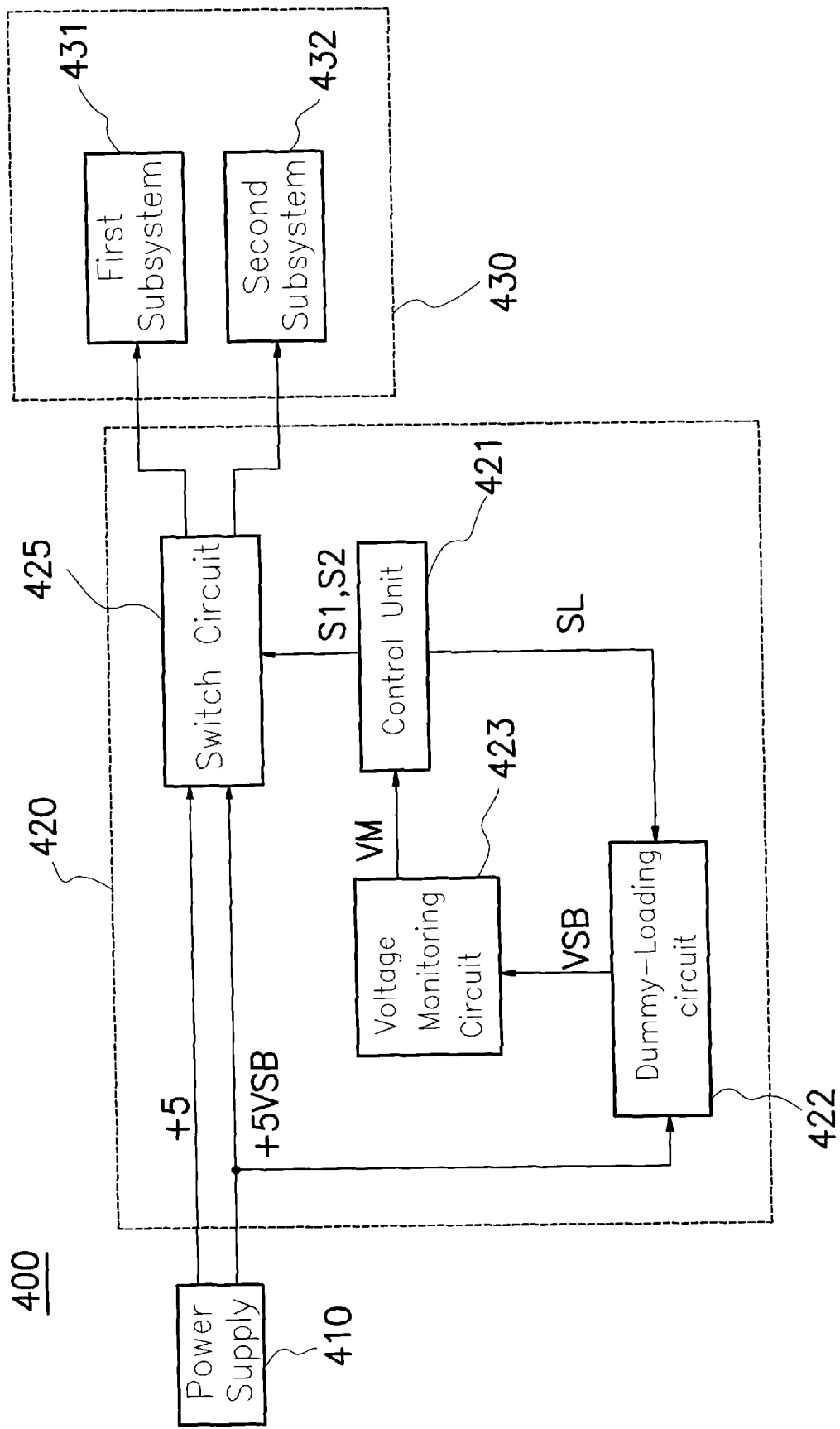
FIG. 4 shows block diagrams of a computer system including an apparatus for detecting capacity of standby power according to a preferred embodiment of the invention.

FIG. 4 shows block diagrams of a computer system 400 including an apparatus 420 for detecting capacity of standby power according to a preferred embodiment of the invention. A power supply 410 provides a main power having a voltage level such as +5 V and a standby power having a voltage level such as +5 VSB (5 V for standby power is hereinafter "+5 VSB"), which are applied to a computer subsystem 430 through the apparatus 420. The computer subsystem 430 is a subsystem, which needs a standby power with +5 VSB in a computer system. The computer subsystem 430 is divided into two parts: a first subsystem 431 and a second subsystem 432.

The first subsystem 431 that needs the standby power with +5 VSB relates to normal operation of the whole computer system. The second subsystem 432 relates to additional functions by using the standby power with +5 VSB, and the basic operation of the computer system is not affected when the second subsystem 432 loses the standby power with +5 VSB. Thus, the apparatus 420 is used for automatically detecting the standby power with +5 VSB provided by the power supply 410. When the standby power is not enough for the normal operation of the whole computer system, the apparatus 420 will control the standby power to be applied only to the first subsystem 431. If the standby power is enough for the normal operation of the whole computer system, the apparatus 420 will control the standby power to be applied to both the first and second subsystem 431 and 432.

The apparatus 420 for detecting the capacity of the standby power comprises a control unit 421, a dummy-loading circuit 422, a voltage monitoring circuit 423 and a switch circuit 425. The control unit 421 is used for controlling operation of the apparatus 420. The dummy-loading circuit 422 is controlled by the control unit 421 through a control signal SL and provides a dummy-loading device (not shown) coupled to the standby power to be a dummy loading for the standby power. The voltage monitoring circuit 423 is used for monitoring the variation of standby power while being coupled to the dummy-loading device and output a signal VM to the control unit 421. The signal VM is used for judging the capacity of the standby power supplied by the power supply 410.

The switch circuit 425 is used for select the main power or the standby power which is applied to the second subsystem 432. The switch circuit 425 is also used for switching the operating power of the first subsystem 431 and the second subsystem 432 to the main power with +5 V while testing the capacity of the standby power. The switch circuit helps to prevent voltage variations that affect the normal operation of the first subsystem 431 and the second subsystem 432, and further affect normal operation of the whole computer system. When the apparatus is detecting the capacity of the standby power, the standby power is coupled to the dummy-loading device. The switch circuit 425 is controlled by the control unit 421 through control signals S1 and S2, which are described in detail hereinafter.

Figure 5A:
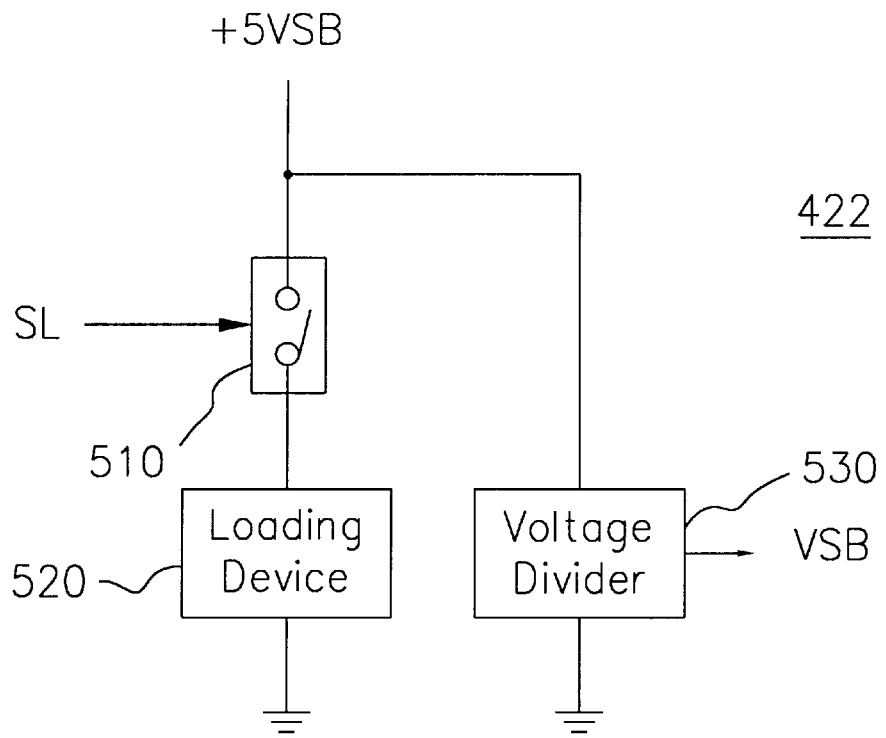
FIG. 5A shows block diagrams of the dummy-loading circuit as shown in FIG. 4.

FIG. 5A shows block diagrams of the dummy-loading circuit 422 as shown in FIG. 4. The dummy-loading circuit 422 includes a loading device 520, a switch 510 and a voltage divider 530. The switch 510 is controlled by the control signal SL supplied by the control unit 421. The switch 510 can be used for make the loading device 520, which is used for a dummy-loading device as described above, connect with or separate form the standby power, thereby testing the capacity of the standby power. The switch 510 can be, for example, an electric switch or a mechanical switch.

The electric switch can be achieved by, for example, using a high power transistor or a field effect transistor. The mechanical switch is implemented by, for example, a relay. The voltage divider 530 is used for decreasing the voltage of standby power which is +5 VSB. The decreased voltage VSB is coupled to the voltage monitoring circuit 423 as shown in FIG. 4, by which the voltage monitoring circuit 423 can monitor variations of the voltage of the standby power. One purpose of the voltage monitoring circuit 423 is to prevent other circuits from being damaged by a high voltage.

Figure 5B:
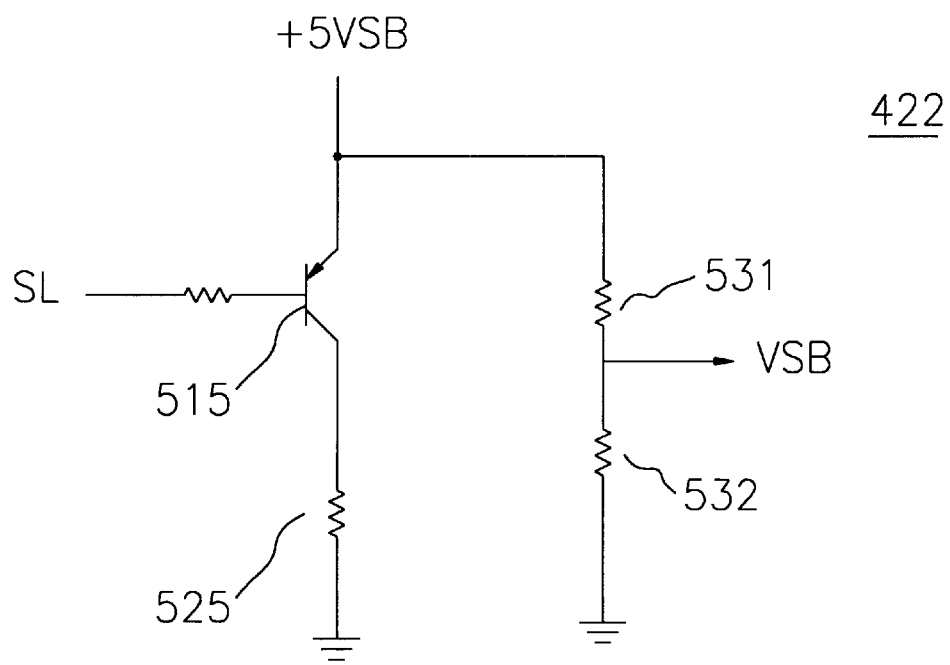
FIG. 5B shows a practical circuit for the dummy load circuit, which corresponds to FIG. 5A.

FIG. 5B shows a practical circuit for the dummy load circuit 422, which corresponds to FIG. 5A. A transistor 515 serves as the switch 510. A resistor 525 serves as the loading device 520, which is a dummy-loading device of the standby power with +5 VSB. Therefore, the resistor 525 must be a resistor that can withstand the application of a high power. When the control signal SL transmitted from the control unit 421 is a low voltage, the transistor 515 is turned on, by which the resistor 525 is coupled to the standby power with +5 VSB. When the test is performed, the control signal SL is changed to a high voltage, the transistor 515 is then turned off, by which the resistor is not coupled to the standby power with +5 VSB. Two resistors 531 and 532 act as the voltage divider 530, and the standby power whose voltage +5 SB is decreased to be a VSB voltage that is coupled to the voltage monitoring circuit 423.

Figure 6:
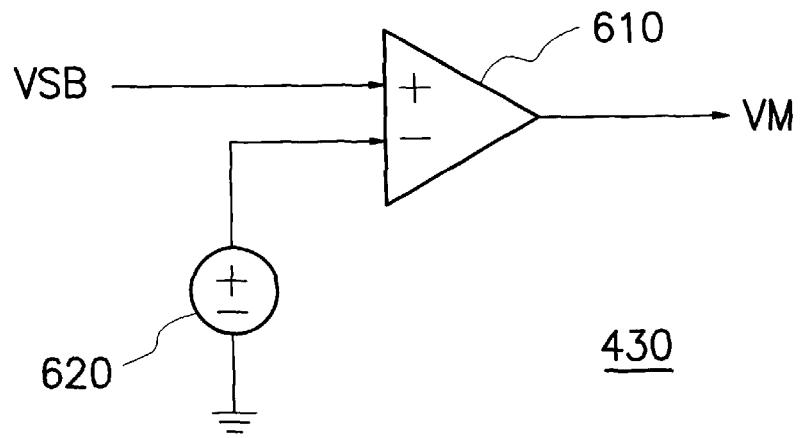
FIG. 6 shows a practical circuit of the voltage monitoring circuit as shown in FIG. 4.

The voltage monitoring circuit 423 can monitor the variations of standby power and generate a monitoring output VM shown in FIG. 4 therewith. The monitoring output VM is transmitted to the control unit 421, with thereby the capacity of the standby power with +5 VSB detects whether there is enough standby power. The voltage monitoring circuit 430 can be operated in several ways, such as using a digital to analog (D/A) converter to read the VSB to judge whether the VSB is over a prescribed voltage or not. Although using a D/A converter can provide a better performance, but the cost is relatively high, and precise data concerning the capacity of the standby power is unnecessary. Therefore, a voltage monitoring circuit 430 can be operated by using a comparator, which is simpler than the D/A converter, as shown in FIG. 6.

The voltage monitoring circuit 430 includes a comparator 610 and a reference voltage source 620. The reference voltage source 620 is designed according to a least allowed voltage of the specification of +5 VSB of the standby power and the proportion of the voltage divider 530. While testing the capacity of the standby power, the loading device 520 shown in FIG. 5 is coupled to the standby power with +5 VSB. When the voltage VSB from the divider 530 is larger than the reference voltage in the reference source 620, the comparator 610 outputs a signal VM with high voltage. If the voltage VSB from the divider 530 is smaller than the reference voltage in the reference source 620, the comparator 610 outputs a signal VM with low voltage, that is, the capacity of the standby power is not enough.

Figure 7:
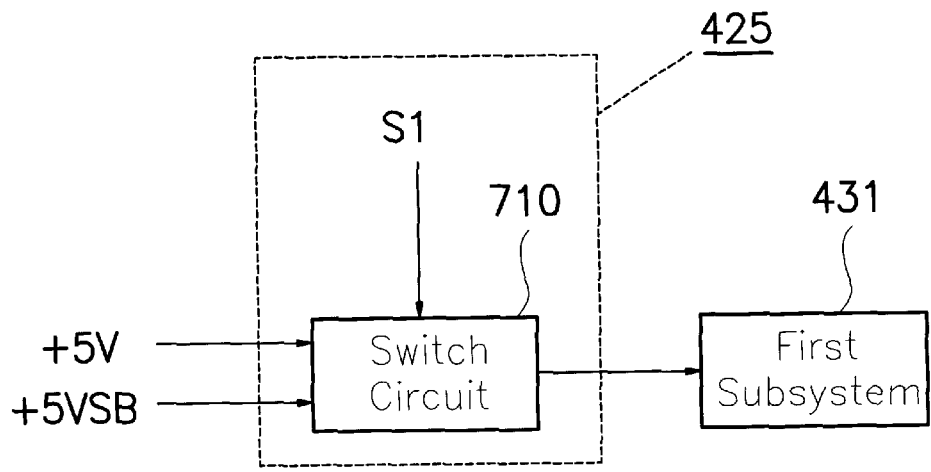
FIG. 7 shows block diagrams of portions of the switch circuit as shown in FIG. 4.

FIG. 7 shows partial block diagrams of the switch circuit 425 and the first subsystem 431 as shown in FIG. 4. The partial block diagrams of the switch circuit 425 are used only for the first subsystem 431, and hereinafter are denoted by a reference number 710. Because the first subsystem 431 needs the standby power with +5 VSB to maintain normal operation of the whole computer system, and the standby power with +5 VSB may be unstable while testing the capacity, the switch circuit 710 therefore switches the operating power of the first subsystem to the main power with voltage +5 V, by which to prevent affecting the normal operation of the computer system. The control signal S1 is outputted from the control unit 421, and the switch circuit 710 is controlled by the control signal S1.

Figure 8:
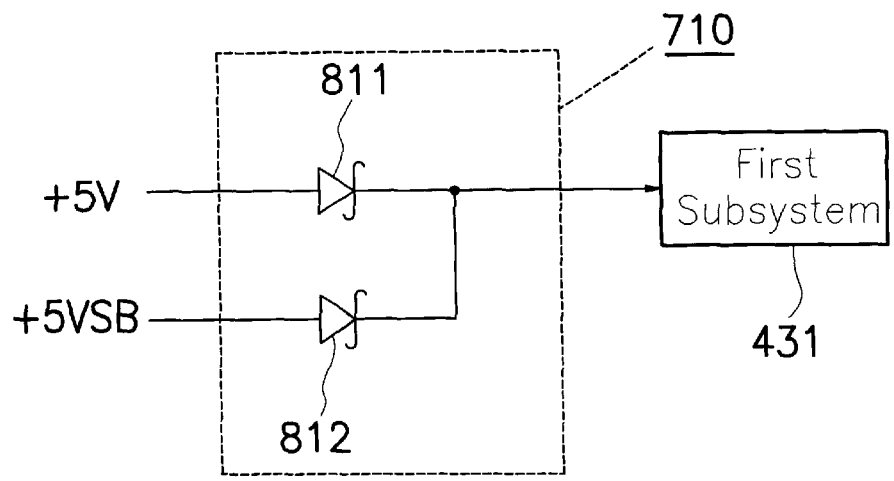
FIG. 8 shows a practical circuit of portions of the switch circuit as shown in FIG. 4.

The switch circuit 710 can be achieved by many ways. One of these ways is shown in FIG. 8. In FIG. 8, the switch circuit 710 is achieved by diodes. For reducing the forward bias of the turned-on diode and increasing the speed of turning on/off, the diodes can be, for example, Schottky diodes. As shown in FIG. 8, the switch circuit 710 is achieved by two diodes 811 and 812. When the main power with +5 V is turned off, the computer stops operating. The first subsystem 431 can continuously work by using the standby power through the diode 812. When the main power with +5 V is turned on, the computer system begins to work. The first subsystem 431 can work by the main power with +5 V through the diode 811 or by the standby power with +5 VSB through the diode 812.

While performing the test of capacity, the standby power with +5 VSB may be reduced to below the normal voltage and the diode 812 may be turned off by a reverse bias. The first subsystem 431 still can work by using the main power through the diode 811. Therefore, the variations of the standby power with +5 VSB do not affect normal operation of the first subsystem 431. Because the diodes used in this circuit can be automatically turned on or off, which depend on variations of the main power with +5 V and standby power with +5 VSB, it is therefore not necessary for the switch circuit 710 to be controlled by the control unit 421.

Figure 9:
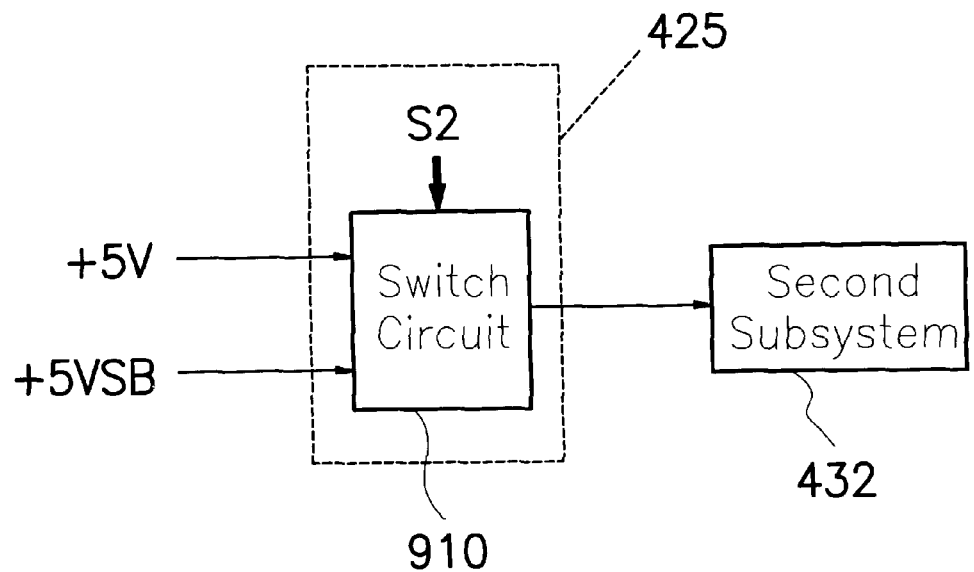
FIG. 9 shows block diagrams of portions of the switch circuit as shown in FIG. 4.

FIG. 9 shows partial block diagrams of the switch circuit 425 and the second subsystem 432 as shown in FIG. 4. The partial block diagrams of the switch circuit 425 are used only for the second subsystem 432, and hereinafter are denoted by a reference number 910. Because the second subsystem 432 can selectively be coupled to the standby power with +5 VSB, the second subsystem 432 is coupled to the standby power with +5 VSB when the capacity of the standby power with +5 VSB is enough. Thus, the working power of the second subsystem can by supplied by the standby power with +5 VSB while the computer system is turned off. Therefore, more and more functions can be added to the computer system by the selectivity of the working power of the second subsystem 432, such as keyboard wakeup or suspending information to RAM.

If the standby power with +5 VSB is not enough, then the standby power with +5 VSB is selectively only applied to the essential first subsystem 431, which maintains the normal operation of the whole computer system. The second subsystem 432 with additional functions is not coupled to the standby power with +5 VSB. But when the computer system is turned on, the second subsystem 432 uses the main power from the switch circuit 910 and then begins to work to provide additional functions. The switch circuit 910 controlled by the control signal S2, by which the main power with +5 V or the standby power with +5 VSB is applied, to the second subsystem 432.

Figure 10:
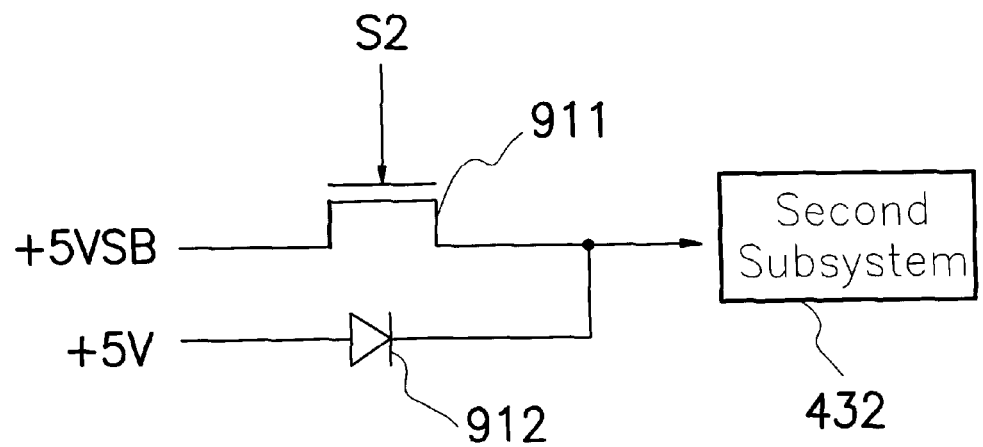
FIG. 10 shows a practical circuit of portions of the switch circuit as shown in FIG. 4.

The switch circuit 910 can be achieved by many ways, such as a combination of a transistor 911 and a diode 912, as shown in FIG. 10. The transistor 911, for example, a field effect transistor (FET), serves as an electric switch. The FET has a lower turn-on voltage than the bipolar transistor and is controlled by voltages, that is, the controlled current applied to the gate of the FET is small, by which an additional driving circuit is not necessary.

The transistor 911 is controlled by the control signal S2 transmitted from the control unit 421. When the standby power with +5 VSB is enough, the transistor 911 is turned on by the control signal S2. The second subsystem still uses the working power from the standby power with +5 VSB while the computer is turned off, by which there are more and more functions that are added to the computer system. When the capacity of the standby power is not enough, the transistor 911 is turned off by the control signal S2. In the meantime, the second subsystem 432 stops working and no more power is needed. When the computer system is turned on, the subsystem 432 is then provided with working power through the diode 912. Thus, additional function, such as keyboard wakeup is terminated when the computer system is turned off and the capacity of the standby power is not enough. But the keyboard still working properly when the computer system is turned on.

Figure 11:
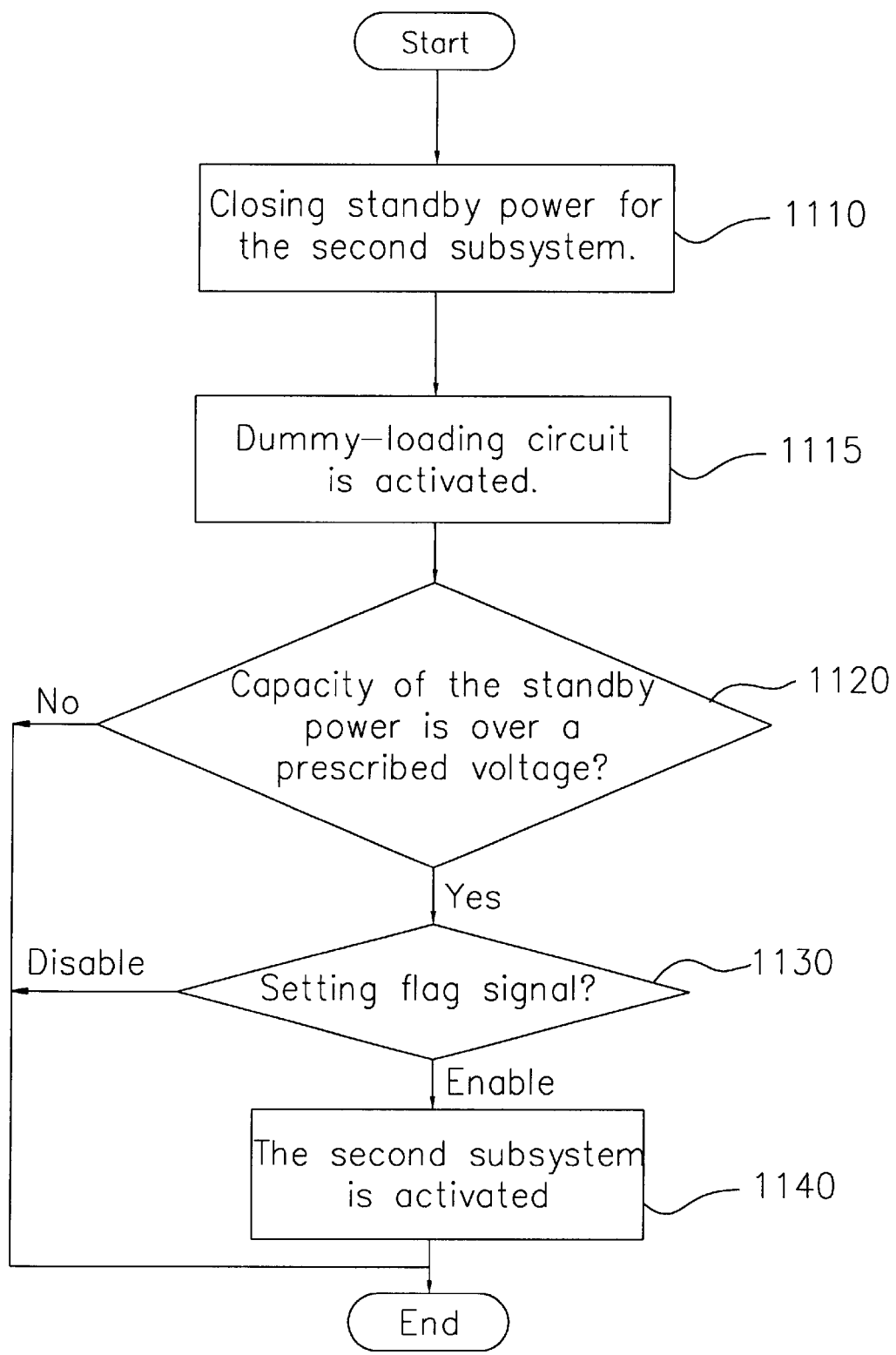
FIG. 11 shows a flowchart of the apparatus for detecting capacity of standby power according to a preferred embodiment of the invention.

In FIG. 11, the steps for operating the invention to detect the capacity of the standby power are described hereinafter in combination with FIGS. 4–10.

In the beginning of step 1110, the power supply 410 is turned on and a main power with +5 V is applied to the second subsystem 432, which is under control of the switch 910. Next, in step 1115, the dummy-loading circuit 422 is activated, by which the loading device 520 is coupled to the standby power with +5 VSB to test the capacity of the standby power. In the meantime, the voltage monitoring circuit 423 monitors the variations of the standby power with +5 VSB, and then the dummy-loading circuit 422 is deactivated.

In the following step 1120, the voltage monitoring circuit 423 monitors whether the standby power with +5 VSB is reduced to be under a prescribed voltage level by activating the dummy-loading circuit 422. If the standby power with +5 VSB is under the prescribed voltage, it means that the standby power with +5 VSB is insufficient to provide an operating voltage of the second subsystem 432 and sequentially perform the last "End" step. If the standby power with +5 VSB is not lower than the prescribed voltage, it means the standby power with +5 VSB is enough to provide the operating voltage of the second subsystem 432, and the following step 1130 is executed.

In step 1130, a flag signal designated by the user is checked to decide whether the additional functions of the second subsystem 432 are activated or not. If the flag signal is disable, the "End" step is then executed. If the flag signal is enable, the following step 1140 is then executed. In step 1140, the additional functions of the second subsystem 432 are activated, and then the detecting steps are ended.

The above-described function of detecting the capacity of the standby power with +5 VSB is added in the BIOS (Basic Input Output System) of the personal computer. The standby power with +5 VSB is detected while the computer is turned on. When the capacity of the standby power with +5 VSB is enough, additional functions can be activated because the additional functions need more operating power from the standby power with +5 VSB. If the standby power with +5 VSB is not enough, additional functions cannot to be activated to prevent affecting the normal operation of the computer system and prevent cuaseing the power supply or other peripheral equipment to be damaged.

According to the above-described preferred embodiment of an apparatus and a method of detecting the capacity of the standby power, the parts that need the working voltage from the standby power are switched to the main power by a switch circuit. Then a control unit activates a dummy-loading circuit first, thereby a loading device is coupled to the standby power. A voltage monitoring circuit monitors variations of the standby power to judge the capacity of the standby power, by which the switch circuit decides whether the standby power is activated or not. When detecting the capacity of the standby power, a switch circuit is needed to prevent variations of the standby power from affecting the normal operation of the essential circuit, and the operating power is supplied by the standby power.

According to the above described, the advantage of this invention compared with the prior art is that the capacity of the standby power is automatically detected. After that, the user can decide whether or not to activate additional functions with the help of a program, by which the computer system is assured to work normally.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for detecting capacity of a power supply to supply a standby power, comprising:

a control unit for controlling the apparatus;

a dummy-loading circuit, for coupling to the standby power and controlled by the control unit, to provide a load to the standby power; and a voltage monitoring circuit, coupled to the dummy-loading circuit and the control unit, for monitoring a voltage of the standby power through the dummy-loading circuit and for outputting a signal to the control unit, wherein while the voltage of the standby power is being detected, the control unit activates the dummy-loading circuit and receives information of variations of the standby power from the signal outputted from the voltage monitoring circuit, thereby to detect the capacity of the standby power to be below a required minimum amount when the variation of the voltage of the standby power is detected to exceed a prescribed voltage.

2. The apparatus of claim 1, wherein the dummy-loading circuit comprises a loading device and a switch, wherein the loading device is coupled to the standby power through the switch, wherein the switch is under control of the control unit, when the switch is turned on, the loading device is coupled to the standby power and is the load of the standby power, when the switch is turned off, the loading device is separated from the standby power and is not the load of the standby power.

3. The apparatus of claim 1, wherein, the power supply comprises a main power.

4. The apparatus of claim 3, further comprising a switch circuit, wherein either the main power or the standby power is selectively switched to a subsystem of a computer system.

5. The apparatus of claim 4, wherein the subsystem comprises:

a first subsystem, for normal operation of the computer system, wherein operating power of the first subsystem is provided by the standby power;

a second subsystem, for additional functions of the computer system wherein operating power of the second subsystem is provided by the standby power and the abnormal operation of the second subsystem does not affect the normal operation of the computer system.

6. The apparatus of claim 5, wherein the switch circuit comprises a first switch circuit, wherein the operating power of the first subsystem is provided by the standby power through the first switch circuit, wherein if the capacity of the standby power is detected to be lower than the prescribed voltage, the operating power of the first subsystem is switched to the main power by the first switch circuit.

7. The apparatus of claim 6, wherein the switch circuit further comprises a second switch circuit, wherein if the capacity of the standby power is detected to be not enough, the operating power of the second subsystem is switched to the main power, wherein if the capacity of the standby power is detected to be enough, the operating power of the second subsystem is switched to the standby power by the second switch circuit.

8. A method for detecting capacity of a standby power of a power supply, the power supply further comprises a main power, wherein the method comprises:

selectively coupling a loading device to the standby power to apply a load to the standby power;

monitoring variations of the standby power, wherein if the voltage of the standby power is lower than a prescribed voltage, then the standby power is detected to be less than a required minimum amount; and applying either the main power or the standby power to a subsystem of a computer by a switch circuit according to whether the standby power is detected to be less than the required minimum amount.

9. The method of claim 8, wherein the power supply further comprises a main power, wherein the method further comprises providing either the main power or the standby power to a subsystem of a computer system by a switch circuit.

10. The method of claim 8, wherein the switch circuit comprises a first switch circuit, wherein the method further comprises:

switching a part of a demand for operating power of the subsystem of the computer to the main power when the load is applied to the standby power and the standby power is detected to be less than the required amount.

11. The method of claim 10, wherein the switch circuit further comprises a second switch circuit, wherein the method further comprises:

switching the partial operating power of the subsystem of the computer to the main power when the capacity of the standby power is detected to be not enough; and switching the partial operating power of the subsystem to the standby power when the capacity of the standby power is detected to be enough.

* * * * *